United States Patent [19]
Sakata

[11] Patent Number: 5,444,787
[45] Date of Patent: Aug. 22, 1995

[54] AUDIO SIGNAL PROCESSING DEVICE

[75] Inventor: Haruo Sakata, Tokyo, Japan

[73] Assignee: Clarion Co., Ltd., Tokyo, Japan

[21] Appl. No.: 169,610

[22] Filed: Dec. 17, 1993

[30] Foreign Application Priority Data

Jan. 22, 1993 [JP] Japan .................. 5-027599

[51] Int. Cl.$^6$ .......................................... H04B 15/00
[52] U.S. Cl. ........................................... 381/94
[58] Field of Search ............... 348/738; 381/94, 2–16, 381/98–103; 455/303, 305, 306, 308, 312

[56] References Cited

U.S. PATENT DOCUMENTS 4,300,019  11/1981  Toyomaki ........................... 381/3
4,587,644   5/1986  Fujiie ................................ 369/44

Primary Examiner—Edward L. Coles, Sr.
Assistant Examiner—Jerome Grant, II
Attorney, Agent, or Firm—Koda and Androlia

[57] ABSTRACT

An audio signal processing device extracts a first series of frequency components from a first input signal with a high signal-to-noise ratio and a second series of frequency components from a second signal with a low signal-to-noise ratio. A middle-amplitude slice of each of the first series is extracted by limiting the amplitude of each to a lower threshold level, subtracting the result from the signal before limiting, and limiting the amplitude of this difference to an upper threshold level. The gain of each middle-amplitude slice is controlled in response to noise from a second input signal. Each result of controlling the gain is added to a corresponding frequency component extracted from the second input signal. Each frequency component of the second input signal is amplitude-limited and the result subtracted from a corresponding result of adding. The results of the latter subtraction are added together to form a composite signal similar to the second, low signal-to-noise ratio signal, with a greatly reduced noise level.

17 Claims, 5 Drawing Sheets

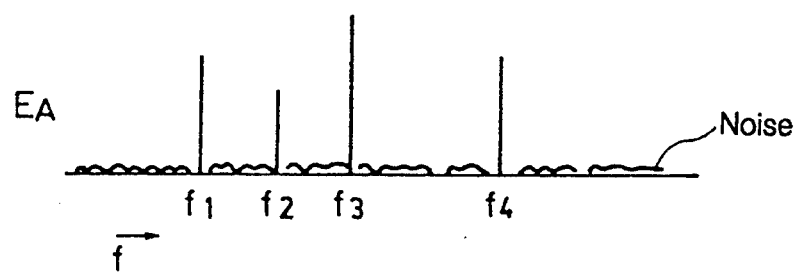
Fig. 3a
Fig. 3b
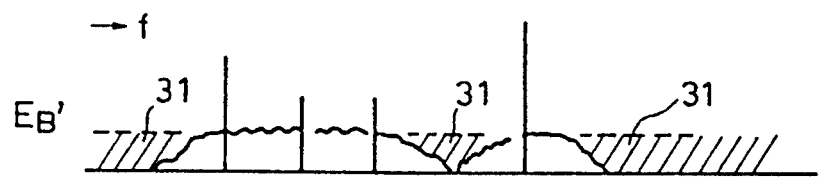
Fig. 3c
Fig. 3d
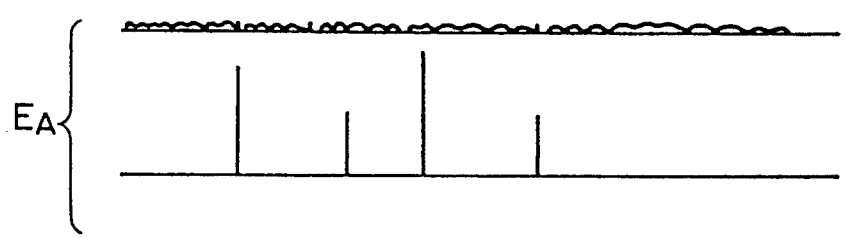
Fig. 3e
Fig. 3f
Fig. 3g
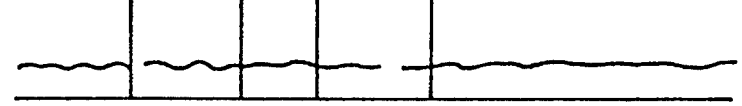
Fig. 3h
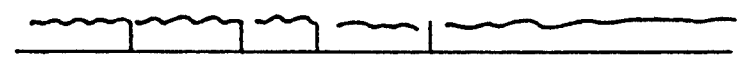
Fig. 3i
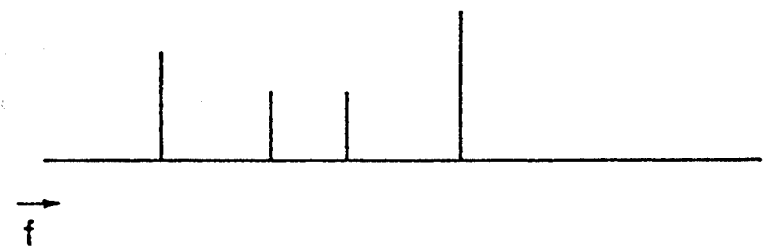

AUDIO SIGNAL PROCESSING DEVICE

BACKGROUND OF THE INVENTION

This invention relates to a signal processing device with a band splitter, and, in particular, to an improvement of this device to control the noise in an audio signal with a low ratio of signal to noise.

Generally, electromagnetic waves that carry FM stereophonic broadcasts include a subcarrier containing a sum signal and a difference signal which are used to separate the stereo components of the main channel. The sum signal results from adding left and right signals from an audio source. The difference signal results from subtracting one of the left and right signals from the other. The sum and difference signals are both used to generate a broadcast transmission signal by modulating a carrier signal. The modulated br. oadcast transmission signal carries the sum signal in an FM subcarrier and the difference signal in an amplitude-modulated ("AM") subcarrier. The AM subcarrier is a suppressed carrier double sideband ("SCDSB") wave.

A subcarrier of 38 kHz is required at a receiver to permit the difference signal to demodulate the SCDSB wave. Therefore broadcasting stations transmit a pilot subcarrier of 19 kHz. In the receiver, the pilot subcarrier signal is doubled in frequency to 38 kHz, which is coherent in phase with the AM and FM subcarrier signals.

Prior-art methods of controlling noise employ a signal processing device that includes a band splitter. Such a device improves the signal by eliminating noise in some frequency bands. However, it leaves unmodified the noise in other frequency bands of the improved signal. Thus the improvement in signal-to-noise ratio of the prior-art device is less than optimal.

OBJECTS AND SUMMARY OF THE INVENTION

An object of the present invention is to provide an audio signal processing device which overcomes the drawbacks of the prior art.

A further object of the present invention is to control noise in the low signal-to-noise ratio difference signal of an FM stereophonic signal by making use of the high signal-to-noise ratio sum signal.

Still a further object of the present invention is to provide a receiver with improved sound quality.

Briefly stated, the present invention provides a audio signal processing device which extracts a first series of frequency components from a first input signal with a high signal-to-noise ratio and a second series of frequency components from a second signal with a low signal-to-noise ratio. A middle-amplitude slice of each of the first series is extracted by limiting the amplitude of each to a lower threshold level, subtracting the result from the signal before limiting, and limiting the amplitude of this difference to an upper threshold level. The gain of each middle-amplitude slice is controlled in response to noise from a second input signal. Each result of controlling the gain is added to a corresponding frequency component extracted from the second input signal. Each frequency component of the second input signal is amplitude-limited and the result subtracted from a corresponding result of adding. The results of the latter subtraction are added together to form a composite signal similar to the second, low signal-to-noise ratio signal, with a greatly reduced noise level.

According to an embodiment of the present invention, there is disclosed, an audio signal processing device comprising: first filter means for decomposing a first signal into a first frequency component of the first signal, the first frequency component having a first amplitude and a first central frequency, second filter means for decomposing a second signal into a second frequency component of the second signal, the second frequency component having a second amplitude and a second central frequency equal to the first central frequency, means for limiting the first amplitude of the first frequency component to produce a first intermediate signal, means for subtracting the first intermediate signal from the first frequency component to produce a second intermediate signal, the second intermediate signal having a third amplitude, means for limiting the third amplitude of the second intermediate signal to produce a third intermediate signal, means for adding the third intermediate signal to the second frequency component to produce a fourth intermediate signal, means for limiting the second amplitude of the second frequency component to produce a fifth intermediate signal and means for subtracting the fifth intermediate signal from the fourth intermediate signal.

According to another embodiment of the present invention, there is disclosed, an audio signal processing device comprising: first filter means for decomposing a first signal into a first series of frequency components of the first signal, second filter means for decomposing a second signal into a second series of frequency components of the second signal, each of the first series having an amplitude, each of the second series having an amplitude and a central frequency, each of the first series having a central frequency equal to the central frequency of a corresponding one of the second series, means for limiting the amplitude of each of the first series to produce a first intermediate series of signals, means for subtracting each of the first intermediate series from a corresponding one of the first series to produce a second intermediate series of signals, each of the second intermediate series having an amplitude, means for limiting the amplitude of each of the second intermediate series to produce a third intermediate series of signals, means for adding each of the third intermediate series to a corresponding one of the second series of frequency components to produce a fourth intermediate series of signals, means for limiting the amplitude of each of the second series to produce a fifth intermediate series of signals, means for subtracting each of the fifth intermediate series from the fourth intermediate series to produce a sixth intermediate series of signals and means for combining every one of the sixth intermediate series to produce a combined signal.

According to still another embodiment of the present invention, there is disclosed, a method for processing a signal, comprising the steps of: decomposing a first signal into a first frequency component of the first signal, the first frequency component having a first amplitude and a first central frequency, decomposing a second signal into a second frequency component of the second signal, the second frequency component having a second amplitude and a second central frequency equal to the first central frequency, limiting the first amplitude of the first frequency component to produce a first intermediate signal, subtracting the first intermediate signal from the first frequency component to produce a second intermediate signal, the second intermediate signal having a third amplitude, limiting the third amplitude of the second intermediate signal to produce a third intermediate signal, adding the third intermediate signal to the second frequency component to produce a fourth intermediate signal, limiting the second amplitude of the second frequency component to produce a fifth intermediate signal and subtracting the fifth intermediate signal from the fourth intermediate signal.

According to still another embodiment of the present invention, there is disclosed, an method for processing a signal comprising the steps of: decomposing a first signal into a first series of frequency components of the first signal, decomposing a second signal into a second series of frequency components of the second signal, each of the first series having an amplitude, each of the second series having an amplitude and a central frequency, each of the first series having a central frequency equal to the central frequency of a corresponding one of the second series, limiting the amplitude of each of the first series to produce a first intermediate series of signals, subtracting each of the first intermediate series from a corresponding one of the first series to produce a second intermediate series of signals, each of the second intermediate series having an amplitude, limiting the amplitude of each of the second intermediate series to produce a third intermediate series of signals, adding each of the third intermediate series to a corresponding one of the second series of frequency components to produce a fourth intermediate series of signals, limiting the amplitude of each of the fourth series to produce a fifth intermediate series of signals, subtracting each of the fifth intermediate series from the fourth intermediate series to produce a sixth intermediate series of signals and combining every one of the sixth intermediate series to produce a combined signal.

The above, and other objects, features, and advantages of the present invention will become apparent from the following description read in conjunction with the accompanying drawings, in which like reference numerals designate the same elements.

BRIEF DESCRIPTION OF THE DRAWINGS

FIG. 3a is a power spectral density function representing a hypothetical high signal-to-noise ratio signal.

FIG. 3b is a power spectral density function representing a hypothetical low signal-to-noise ratio signal.

FIG. 3c is a power spectral density function representing the hypothetical low signal-to-noise ratio signal of FIG. 3b improved by processing with the prior-art device of FIG. 5.

FIG. 3d is a power spectral density function representing the hypothetical high signal-to-noise ratio signal of FIG. 3a after processing through a limiter 13 in the device of FIG. 1.

FIG. 3e is a power spectral density function representing the hypothetical high signal-to-noise ratio signal of FIG. 3a which has been further processed through a difference circuit 14 in the device of FIG. 1.

FIG. 3f is a power spectral density function representing the hypothetical high signal-to-noise ratio signal of FIG. 3a which has been further processed by a limiter 15 and a gain control circuit 16 in the device of FIG. 1.

FIG. 3g is a power spectral density function representing the hypothetical low and high signal-to-noise ratio signals of FIGS. 3a and 3b which have been processed by a summing circuit 17 in the device of FIG. 1.

FIG. 3h is a power spectral density function representing hypothetical low and high signal-to-noise ratio signals of FIGS. 3a and 3b which have been further processed by a limiter 18 in the device of FIG. 1.

FIG. 3i is a power spectral density function representing the hypothetical low signal-to-noise ratio signal of FIG. 3b which has been further processed by a difference circuit 19 in the device of FIG. 1.

FIG. 4a is a time-domain representation of the signal of FIG. 3a.

DETAILED DESCRIPTION OF THE PREFERRED EMBODIMENT

Figure 5:
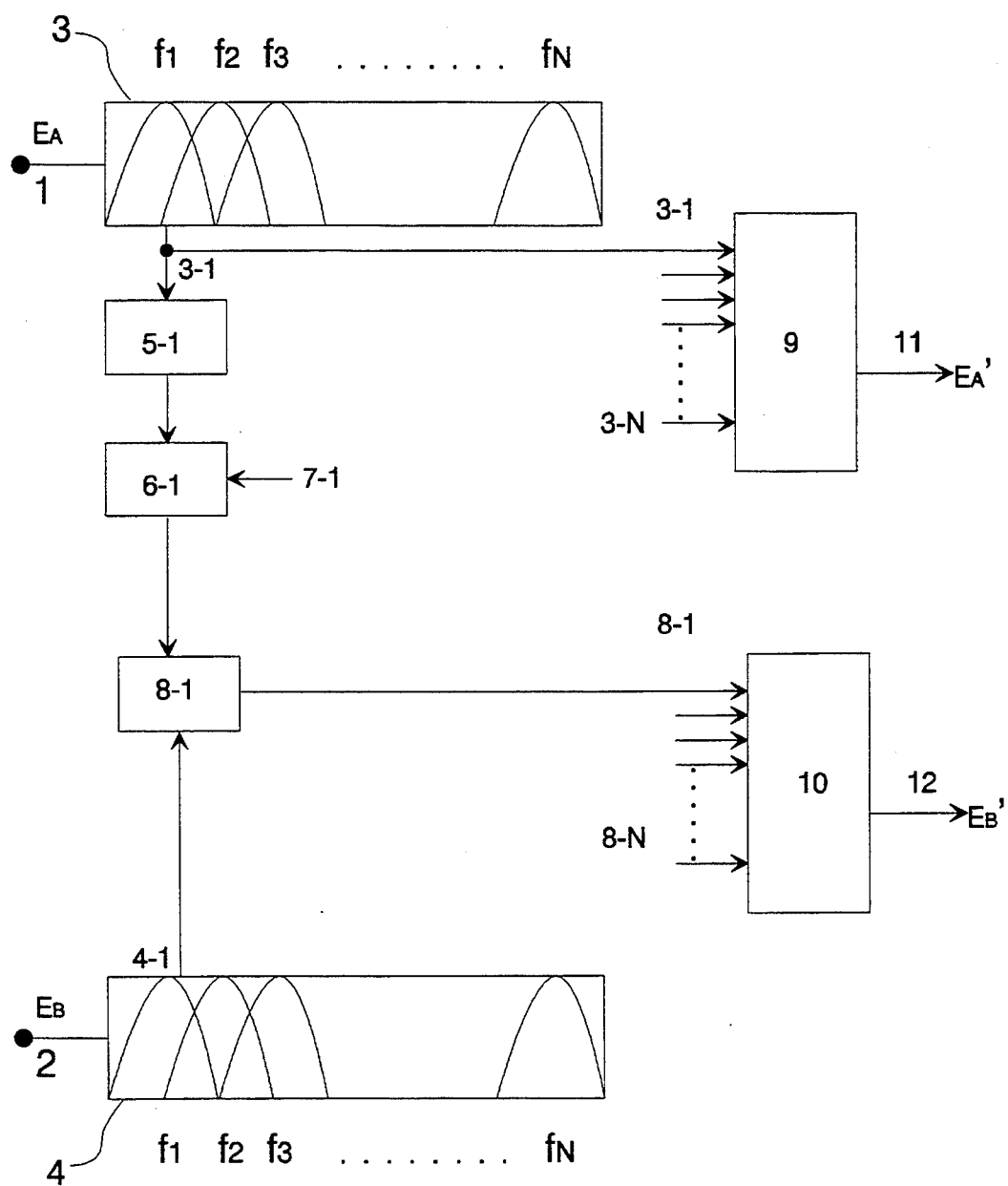
FIG. 5 is a block diagram of an audio signal processing device of the prior art.

Referring to FIG. 5, Japanese laid-open patent SN 1-19862 shows an audio signal processing device employing band splitters 3 and 4. A signal $E_A$, having a high signal-to-noise ratio, is applied to band splitter 3. Band splitter 3 includes N narrow-band-pass filters with central frequencies $f_1$-$f_N$. A low signal-to-noise ratio signal $E_B$, which is complementary to high signal-to-noise ratio signal $E_A$, is applied to band splitter 4. Such complementary signals can be the sum and difference signals of an FM broadcast transmission. In an FM transmission, the sum signal would be the high signal-to-noise ratio signal $E_A$ and the difference signal the low signal-to-noise ratio signal $E_B$. Band splitter 4 also includes N narrow-band-pass filters with central frequencies $f_1$-$f_N$ identical to those in band splitter 3.

Band splitter 3 outputs N sub-band output signals, each of which corresponds to one of central frequencies $f_1$-$f_N$. The following discussion is confined for clarity to the first of these signals, sub-band output 3-1. Sub-band output 3-1, from the band-pass filter with central frequency $f_1$, is applied to an amplitude detector 5-1. Output from amplitude detector 5-1 is a signal that indicates the amplitude of sub-band output 3-1. For example, the output of amplitude detector 5-1 could be a voltage signal proportional to root-mean-square (RMS) power output. Output from amplitude detector 5-1 is applied to a difference circuit 7-1, which compares the signal with a fixed reference level, for example, a reference voltage $E_R$.

Band splitter 4 outputs N sub-band output signals 4-1 through 4-N, each of which corresponds to one of central frequencies $f_1$-$f_N$. Again, for clarity, the processing of only the first of these, sub-band output 4-1, is described. Sub-band output 3-1 is applied to amplitude detector 5-1. A corresponding sub-band output 4-1 from band splitter 4 is applied to a throttling device 8-1. Throttling device 8-1 controls the output of sub-band output 4-1 in response to the output from amplitude detector 5-1. Throttling device 8-1 could be a switch, a gain control circuit, or an equivalent device. If the output signal from amplitude detector 5-1 is equal to or greater than the fixed reference level, throttling device 8-1 outputs sub-band output 4-1. If the output signal from amplitude detector 5-1 is less than the fixed reference level, the output from throttling device 8-1 falls to a reduced level or to zero.

Sub-band outputs 4-2 through 4-N (not shown) are applied to respective throttling devices 8-2 through 8-N (not shown). Outputs of throttling devices 8-2 through 8-N are added, together with the output of throttling device 8-1, by an adder 10. Adder 10 outputs a composite signal $E_B$. Each of throttling devices 8-2 through 8-N is controlled by an output of a respective one of amplitude detectors 5-1 through 5-N (not shown). Sub-band outputs 3-1 through 3-N are added together at an adder 9 to become composite signal $E_A'$.

Referring to FIG. 3a, a power spectral density function for signal $E_A$, which has a high signal-to-noise ratio, is shown. Power levels at frequencies $f_1$, $f_2$, $f_3$, and $f_4$ are high relative to noise 30A occurring at all frequencies between. FIG. 3b shows a power spectral density function for corresponding signal $E_B$, which has a low signal-to-noise ratio. The intervals between central frequencies $f_1$, $f_2$, $f_3$, and $f_4$ are filled with noise at comparatively high power levels. Thus, the spectral power of the noise in signal $E_A$ is comparatively low, while the spectral power of the noise in signal $E_B$ is comparatively high. The non-noise parts of the signals are contained in the spikes at frequencies $f_1$, $f_2$, $f_3$, and $f_4$.

As a result of the signal processing performed by the device of FIG. 5, the noise in signal $E_B$ in those frequency ranges covered by the sub-band output of amplitude detectors 5-1, 5-2, 5-3, and 5-4 is transmitted. Any output in frequency ranges outside the sub-band output of amplitude detectors 5-1, 5-2, 5-3 and 5-4 is not transmitted. The power spectral density function of the resulting signal $E_B'$ is shown in FIG. 3c. Only the noise within sub-bands of frequencies $f_1$, $f_2$, $f_3$ and $f_4$ remains. The noise (or any signal) from an area 31, shown in the shaded region of FIG. 3c, is not transmitted, and the signal-to-noise ratio of low signal-to-noise ratio signal $E_B$ is thereby increased.

As FIG. 3c makes clear, though the prior-art methods control noise in shaded area 31, they have no effect on the noise from subbands of central frequencies $f_1$, $f_2$, $f_3$, $f_4$, thereby making the improvement of signal-to-noise ratio less than optimal.

Figure 1:
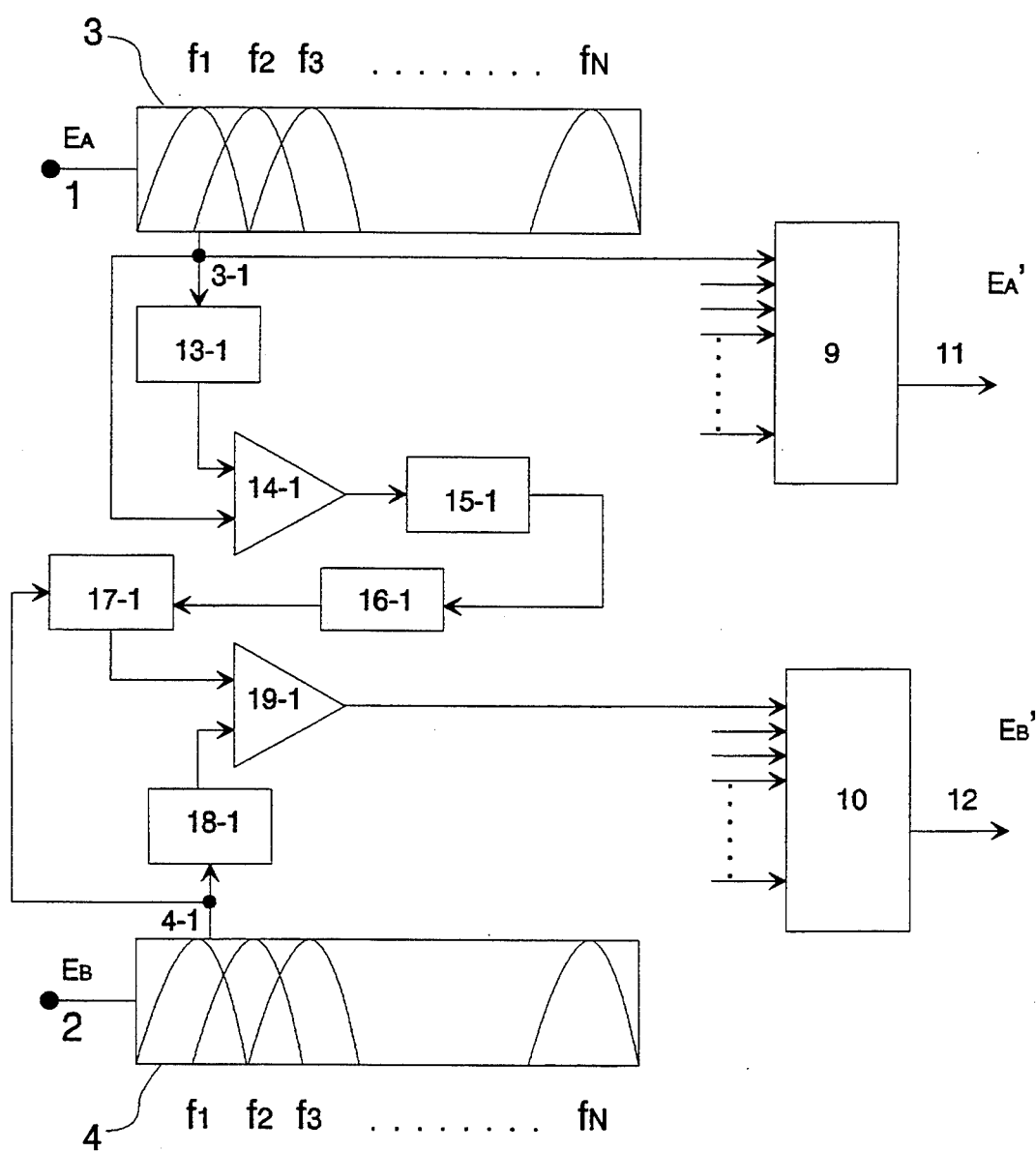
FIGS. 1 & 1a are block diagrams showing an audio signal processing device with a band splitter according to an embodiment of the present invention.

Referring to FIG. 1, a signal processing circuit according to an embodiment of the present invention includes a terminal 1 through which a high signal-to-noise ratio signal $E_A$ is applied to a band splitter 3. High signal-to-noise ratio signal $E_A$ could be the sum signal of an FM broadcast transmission. Band splitter 3 outputs sub-band output signals 3-1 through 3-N (sub-band output signals 3-2 through 3-N are not shown) with respective central frequencies $f_1$ through $f_N$ (central frequencies $f_2$ through $f_N$ are not shown). A low signal-to-noise ratio signal $E_B$ is applied through a terminal 2 to another band splitter 4. Low signal-to-noise ratio signal $E_B$ could be the difference signal of the same FM broadcast transmission as that from which high signal-to-noise ratio signal $E_B$ is derived. Band splitter 4 outputs sub-band output signal 4-1 through 4-N (sub-band output signals 4-2 through 4-N are not shown) with respective central frequencies $f_1$ through $f_N$ that are equal to the central frequencies from band splitter 3 (central frequencies $f_2$ through $f_N$ are not shown). The following discussion applies to each of N identical circuits, for processing each of sub-band output signals 3-1 through 3-N and sub-band output signals 4-1 through 4-N.

For clarity, only the circuit elements for processing sub-band outputs 3-1 and 4-1 are shown in FIG. 1. However, the discussion and FIG. 1 circuit elements apply equally to corresponding elements used to process sub-band output signals 3-2 through 3-N and sub-band output signals 4-2 through 4-N.

Sub-band output signal 3-1 is applied to a limiter 13-1, whose output is applied to a first input of a difference circuit 14-1. Sub-band output signal 3-1 is also applied to a second input of difference circuit 14-1. If necessary, the signal from limiter 13-1 is applied to a band-splitter (not shown) with characteristics identical to band-splitter 3. A signal from difference circuit 14-1 is applied to limiter 15-1. An output of limiter 15-1 is applied to gain control circuit 16-1. The output of limiter 15-1 and 16-1 is an amplitude-limited version of the output of difference circuit 14-1.

Figure 1A:
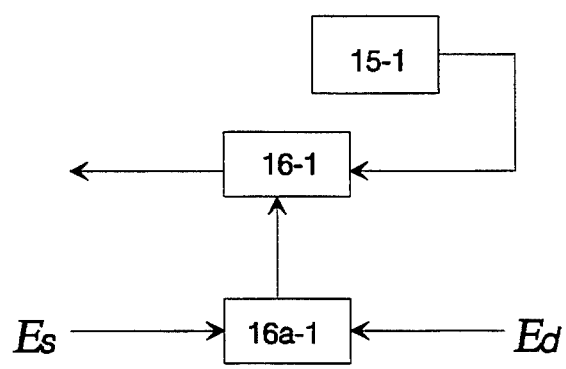

Gain-control circuit 16-1 amplifies the signal from limiter 15-1 responsively to a noise level of low signal-to-noise ratio signal $E_B$. For example, according to one embodiment of the present invention, the gain of gain-control circuit 16-1 is varied in proportion to a parameter identified with noise in low signal-to-noise ratio signal $E_B$. Referring to FIG. 1a, an AM demodulator 16a-1 performs synchronous detection of the stereo signal $E_S$. Stereo signal $E_S$ is the double side-band signal from which low-signal-to-noise ratio signal $E_B$ is derived when the present invention is applied to an FM stereo radio. Stereo signal $E_S$ contains both the desired stereo signal and noise. Synchronous detection of stereo signal $E_S$ by AM demodulator 16a-1 using a detection signal in phase with the subcarrier signal of the stereo signal $E_S$ extracts the desired audio signal with noise. Synchronous detection using a synchronous detection signal that is $\pi/2$ out of phase with the subcarrier frequency extracts a signal which is proportional to the noise. A detailed description of an embodiment for measuring this type of noise may be found in Japanese Provisional Patent Publication SHO61-215459.

An output of gain control circuit 16-1 is applied to a first input of summing circuit 17-1. An output from summing circuit 17-1 is applied to a first input of difference circuit 19-1. Difference circuit 19-1 subtracts the output of gain control circuit 16-1 from an output of a limiter 18-1.

At the same time that sub-band output signal 3-1 undergoes the process described above, a signal $E_B$ with a low signal-to-noise ratio is applied to band splitter 4. Signal $E_B$ is the difference signal in the FM subcarrier, and is very closely related to the high signal-to-noise ratio sum signal $E_A$. For example, signal $E_A$ could be the sum signal corresponding to an FM stereophonic broadcast transmission; signal $E_B$, the difference signal from the same transmission.

A high correlation between two such signals means that corresponding frequency components of each of signals $E_A$ and $E_B$ contain significant power at the same times. Thus, if, at a given instant, most of the power in signal $E_A$ is contained in frequency components $f_1$, $f_2$, and $f_3$, there is a high likelihood that substantial power is contained in some or all of the $f_1$, $f_2$, and $f_3$ frequency components of signal $E_B$ at the same instant.

Signal $E_B$ with a low signal-to-noise ratio is applied to band-splitter 4. Band-splitter 4 is identical to band splitter 3. Sub-band output signal 4-1 is applied to limiter 18-1, whose output is applied to a first input of difference circuit 19-1. An output signal of difference circuit 19-1 is applied to a summing circuit 10. Identical processing of sub-band output signals 4-2 through 4-N and 3-2 through 3-N occurs simultaneously, resulting in outputs from difference circuits 19-2 through 19-N. Summing circuit 10 combines outputs of all corresponding difference circuits 19-1 through 19-N to generate composite output signal $E_B'$. The composite signal is the result of adding the set of signals together.

Figure 2:
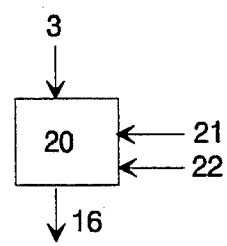
FIG. 2 is a simplified block diagram of a slicer circuit according to another embodiment of the present invention.

FIG. 2 shows an example of a slicer circuit 20. Slicer circuit 20 performs the same function as the combination of limiter 13-1, difference circuit 14-1, and limiter 15-1. Slicer circuit 20 extracts the portion of an input signal falling between a minimum reference voltage input at 21 and a maximum reference voltage input at 22. The single slicer circuit 20 can replace limiter 13-1, difference circuit 14-1, and limiter 15-1 of FIG. 1. In such a circuit, the cutoff amplitude of limiter 13-1 would correspond to the minimum reference voltage input at 21; the cutoff amplitude of limiter 15-1, to the maximum reference voltage input at 22.

FIG. 3d shows a power spectral density function for the composite of all the limited signals from limiters 13-1 through 13-N, that is, for the sum of all of the signals from limiters 13-1 through 13-N. The low, irregular contour represents all sound below an amplitude limit of limiters 13-1 through 13-N. Because high signal-to-noise ratio signal $E_A$ contains relatively little noise, the power level of the signal at frequencies between the spikes at frequencies $f_1$, $f_2$, $f_3$, and $f_4$ is low. In addition, because the noise occurs at low levels, the amplitude limit of limiter 13-1 can be set at a low level. Thus the amplitude of the signal of FIG. 3d is very low at all frequencies.

FIG. 3e shows the power spectral density function of the composite of the output signals from difference circuits 14-1 through 14-N. The signal represented by FIG. 3e is the raw signal $E_B$ with the noise threshold of FIG. 3d subtracted.

FIG. 3f shows the power spectral density function of the composite of the output signals from gain control circuits 16-1 through 16-N. Gain-control circuits 16-1 through 16-N control the signal from limiter 15 according to the noise level of low signal-to-noise ratio signal $E_B$. The composite signal represented by FIG. 3f is thus an amplitude-limited version of the signal of FIG. 3e.

FIG. 3g shows the power spectral density function of the composite of the signals from summing circuits 17-1 through 17-N. Each summing circuit adds a component of low signal-to-noise ratio signal $E_B$ to the output of a corresponding one of gain control circuits 16-1 through 16-N. Thus the composite of the signals from summing circuits 17-1 through 17-N is a sum of the signal of FIG. 3f with the signal of FIG. 3b.

FIG. 3h shows the power spectral density function of the composite of the signals from limiters 18-1 through 18-N. This composite signal is simply an amplitude-limited version of the low signal-to-noise ratio signal of FIG. 3b.

Finally, FIG. 3i shows the power spectral density function of the composite of the signals from difference circuits 19-1 through 19-N. Each of difference circuits 19-1 through 19-N subtracts a corresponding one of the outputs of limiters 18-1 through 18-N from a corresponding one of the outputs of summing circuits 17-1 through 17-N. Thus the composite of the signals from difference circuits 19-1 through 19-N is the result of subtracting the signal of FIG. 3g from the signal of FIG. 3h.

Figure 4:
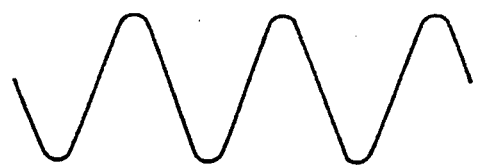
FIG. 4 is a time-domain representation of a hypothetical signal before noise is added.

FIGS. 4a, 4b, and 4e–4i show, approximately, a time-slice, in time-domain representation, of the signals of FIGS. 3a, 3b, and 3e–3i, respectively. FIG. 4 is a time-domain representation of the hypothetical original signal from which the signals of FIGS. 4a, 4b, and 4e–4i are all derived.

Note that the hypothetical situation shown in FIGS. 4a, 4b, and 4e–4i suggests that there is nearly 100 percent correspondence (or correlation) between the original signals from which low and high signal-to-noise ratio signals $E_A$ and $E_B$ derive. That is, the large-scale shape of the signal appears to be identical for signals derived from low and high signal-to-noise ratio signal $E_B$ and high signal-to-noise ratio signal $E_A$ and $E_B$. This is clearly not the case for the power spectra of FIGS. 3a, 3b, and 3e–3i, where the peaks at frequencies $f_1$, $f_2$, $f_3$, $f_4$ for signals derived from high signal-to-noise ratio signals $E_A$ are different from the corresponding peaks for signals derived from high signal-to-noise ratio signals $E_A$. Thus, one would expect to see the different frequency components represented with different emphasis in the respective signals derived from $E_A$ and $E_B$. However, near 100 percent correspondence in the time-domain figures is assumed because it would be very difficult to show in the figures multiple frequencies with moderately high correlation. Moreover, the situation of nearly 100 percent correspondence demonstrates the effect of the signal processing circuit adequately without introducing the complications of not making that assumption. The rough-looking portions of the curves of FIGS. 4a, 4b, 4d, 4g, and 4h figuratively represent the noise in the signal.

Figure 4A:
Figure 4B:
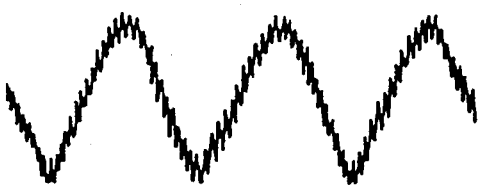
FIG. 4b is a time-domain representation of the signal of FIG. 3b.

Referring to FIG. 4, the original signal is a smooth curve, indicating a noise-free signal. The signal of FIG. 4a is the high signal-to-noise ratio signal, which is essentially identical to the signal of FIG. 4 with a small amount of noise superimposed. The signal of FIG. 4a is thus relatively smooth compared to the signal of FIG. 4b, which represents the low signal-to-noise ratio signal $E_B$.

Figure 4D:
FIG. 4d is a time-domain representation of the signal of FIG. 3d.

The signal of FIG. 4d is the output of limiters 13-1 through 13-N. The curve of FIG. 4d is relatively flat, with low and high frequency components, as suggested by its slow and rapid undulation. The signal of FIG. 4d contains all of the noise of the signal of FIG. 4a at all of the frequencies at which the noise occurs.

Figure 4E:
FIG. 4e is a time-domain representation of the signal of FIG. 3e.

FIG. 4e shows the time-domain representation of the composite of the output signals from difference circuits 14-1 through 14-N. The signal represented by FIG. 4e is the signal $E_B$ with the noise threshold of FIG. 4d stripped out of it.

Figure 4F:
FIG. 4f is a time-domain representation of the signal of FIG. 3f.

FIG. 4f shows the time-domain representation of the composite of the output signals from gain control circuits 16-1 through 16-N. The composite signal represented by FIG. 4f is thus an amplitude-limited version of the signal of FIG. 4e.

Figure 4G:
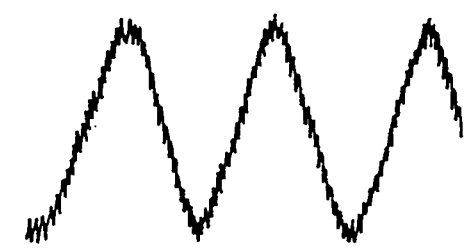
FIG. 4g is a time-domain representation of the signal of FIG. 3g.

FIG. 4g shows the time-domain representation of the composite of the output signals from summing circuits 17-1 through 17-N. The composite of the output signals from summing circuits 17-1 through 17-N is a sum of the signal of FIG. 4f with the signal of FIG. 4b.

Figure 4H:
FIG. 4h is a time-domain representation of the signal of FIG. 3h.

FIG. 4h shows the time-domain representation of the composite of the output signals from limiters 18-1 through 18-N. This composite signal is simply an amplitude-limited version of the low signal-to-noise ratio signal of FIG. 4b.

Figure 4I:
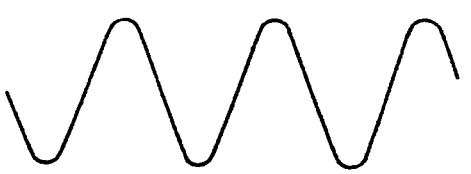
FIG. 4i is a time-domain representation of the signal of FIG. 3i.

Finally, FIG. 4i shows the time-domain representation of the composite of the output signals from difference circuits 19-1 through 19-N. The composite of the signals from difference circuits 19-1 through 19-N is the result of subtracting the signal of FIG. 4g from the signal of FIG. 4h.

With the present invention, it is possible to process an FM audio broadcast with weak field strength by processing the sum (monaural) part of the signal as the high signal-to-noise ratio signal $E_A$ and the stereophonic (difference) part of the signal as the low signal-to-noise ratio signal $E_B$. The result of such processing is greatly improved output with greatly reduced noise.

As described above, with the present audio signal processing device, if there are two signals with high correspondence and greatly differing signal-to-noise ratios, the low signal-to-noise ratio signal can be augmented using information from the high signal-to-noise ratio signal. Through the process of the present invention, sub-band noise is removed, thereby improving the signal-to-noise ratio.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. An audio signal processing device comprising:
   first filter means for decomposing a first signal into a first frequency component of said first signal;
   said first frequency component having a first amplitude and a first central frequency;
   second filter means for decomposing a second signal into a second frequency component of said second signal;
   said second frequency component having a second amplitude and a second central frequency equal to said first central frequency;
   means for limiting said first amplitude of said first frequency component to produce a first intermediate signal;
   means for subtracting said first intermediate signal from said first frequency component to produce a second intermediate signal;
   said second intermediate signal having a third amplitude;
   means for limiting said third amplitude of said second intermediate signal to produce a third intermediate signal;
   means for adding said third intermediate signal to said second frequency component to produce a fourth intermediate signal;
   means for limiting said second amplitude of said second frequency component to produce a fifth intermediate signal; and
   means for subtracting said fifth intermediate signal from said fourth intermediate signal.

2. Apparatus as in claim 1, wherein:
   said first signal has a first signal-to-noise ratio;
   said second signal has a second signal-to-noise ratio; and said first signal-to-noise ratio is greater than said second signal-to-noise ratio.

3. Apparatus as in claim 1, wherein said means for limiting said third amplitude of said second intermediate signal includes means, responsive to a noise level of said second signal, for gain-controlling said third intermediate signal.

4. Apparatus as in claim 1, wherein:
   said first signal is a monaural component of an audio signal derived from a frequency-modulated broadcast signal; and
   said second signal is a stereophonic component of an audio signal derived from a frequency-modulated broadcast signal.

5. An audio signal processing device comprising:
   first filter means for decomposing a first signal into a first series of frequency components of said first signal;
   second filter means for decomposing a second signal into a second series of frequency components of said second signal;
   each of said first series having an amplitude;
   each of said second series having an amplitude and a central frequency;
   each of said first series having a central frequency equal to said central frequency of a corresponding one of said second series;
   means for limiting the amplitude of each of said first series to produce a first intermediate series of signals;
   means for subtracting each of said first intermediate series from a corresponding one of said first series to produce a second intermediate series of signals;
   each of said second intermediate series having an amplitude;
   means for limiting the amplitude of each of said second intermediate series to produce a third intermediate series of signals;
   means for adding each of said third intermediate series to a corresponding one of said second series of frequency components to produce a fourth intermediate series of signals;
   means for limiting the amplitude of each of said second series to produce a fifth intermediate series of signals;
   means for subtracting each of said fifth intermediate series from said fourth intermediate series to produce a sixth intermediate series of signals; and
   means for combining every one of said sixth intermediate series of signals to produce a single combined signal.

6. Apparatus as in claim 5, wherein:
   said first signal has a first signal-to-noise ratio;
   said second signal has a second signal-to-noise ratio; and
   said first signal-to-noise ratio is greater than said second signal-to-noise ratio.

7. Apparatus as in claim 5, wherein said means for combining includes means for summing each of said fourth series of signals to produce said combined signal.

8. Apparatus as in claim 5, wherein said means limiting the amplitude of each of said second intermediate series includes means, responsive to a noise level of said second signal, for gain-controlling each of said third intermediate series.

9. Apparatus as in claim 5, wherein:

said first signal is a monaural component of an audio signal derived from a frequency-modulated broadcast signal; and said second signal is a stereophonic component of an audio signal derived from a frequency-modulated broadcast signal.

10. A method for processing a signal, comprising the steps of:

decomposing a first signal into a first frequency component of said first signal;

said first frequency component having a first amplitude and a first central frequency;

decomposing a second signal into a second frequency component of said second signal;

said second frequency component having a second amplitude and a second central frequency equal to said first central frequency;

limiting said first amplitude of said first frequency component to produce a first intermediate signal;

subtracting said first intermediate signal from said first frequency component to produce a second intermediate signal;

said second intermediate signal having a third amplitude;

limiting said third amplitude of said second intermediate signal to produce a third intermediate signal;

adding said third intermediate signal to said second frequency component to produce a fourth intermediate signal;

limiting said second amplitude of said second frequency component to produce a fifth intermediate signal; and subtracting said fifth intermediate signal from said fourth intermediate signal.

11. A method as in claim 10, wherein said step of limiting said third amplitude includes controlling gain of said third intermediate signal responsively to a noise level of said second signal.

12. A method as in claim 10, wherein:

said first signal is a monaural component of an audio signal derived from a frequency-modulated broadcast signal; and said second signal is a stereophonic component of an audio signal derived from a frequency-modulated broadcast signal.

13. An method for processing a signal comprising the steps of:

decomposing a first signal into a first series of frequency components of said first signal;

decomposing a second signal into a second series of frequency components of said second signal;

each of said first series having an amplitude;

each of said second series having an amplitude and a central frequency;

each of said first series having a central frequency equal to said central frequency of a corresponding one of said second series;

limiting the amplitude of each of said first series to produce a first intermediate series of signals;

subtracting each of said first intermediate series from a corresponding one of said first series to produce a second intermediate series of signals;

each of said second intermediate series having an amplitude;

limiting the amplitude of each of said second intermediate series to produce a third intermediate series of signals;

adding each of said third intermediate series to a corresponding one of said second series of frequency components to produce a fourth intermediate series of signals;

limiting the amplitude of each of said second series to produce a fifth intermediate series of signals;

subtracting each of said fifth intermediate series from said fourth intermediate series to produce a sixth intermediate series of signals; and combining every one of said sixth intermediate series to produce a combined signal.

14. A method as in claim 13, wherein:

said first signal has a first signal-to-noise ratio;

said second signal has a second signal-to-noise ratio; and said first signal-to-noise ratio is greater than said second signal-to-noise ratio.

15. A method as in claim 13, wherein said step of combining includes summing each of said fourth series of signals to produce said combined signal.

16. A method as in claim 13, wherein said step of limiting the amplitude of each of said second intermediate series includes controlling gain in each of said third intermediate series in response to a noise level of said second signal.

17. A method as in claim 13, wherein:

said first signal is a monaural component of an audio signal derived from a frequency-modulated broadcast signal; and said second signal is a stereophonic component of an audio signal derived from a frequency-modulated broadcast signal.

* * * * *